(12) United States Patent
Notani et al.

(10) Patent No.: US 11,226,752 B2
(45) Date of Patent: Jan. 18, 2022

(54) FILTERING MEMORY CALIBRATION

(71) Applicant: Apple Inc., Cupertino, CA (US)

(72) Inventors: Rakesh L. Notani, Sunnyvale, CA (US); Robert E. Jeter, Santa Clara, CA (US); Suhas Kumar Suvarna Ramesh, Santa Clara, CA (US); Naveen Kumar Korada, Pleasanton, CA (US); Mohammad Rizwan, Santa Clara, CA (US); Alma L. Juarez Dominguez, Santa Clara, CA (US); John H. Kelm, Belmont, CA (US); Matthew R. Johnson, Newark, CA (US)

(73) Assignee: Apple Inc., Cupertino, CA (US)

( * ) Notice: Subject to any disclaimer, the term of this patent is extended or adjusted under 35 U.S.C. 154(b) by 222 days.

(21) Appl. No.: 16/293,398

(22) Filed: Mar. 5, 2019

(65) Prior Publication Data
US 2020/0285406 A1 Sep. 10, 2020

(51) Int. Cl.
*G06F 3/06* (2006.01)
*G11C 7/22* (2006.01)
(Continued)

(52) U.S. Cl.
CPC .......... *G06F 3/0634* (2013.01); *G06F 3/0604* (2013.01); *G06F 3/0673* (2013.01);
(Continued)

(58) Field of Classification Search
CPC ............... G06F 1/00–3296; G06F 3/00; G06F 3/06–0689; G06F 5/00–16;
(Continued)

(56) References Cited

U.S. PATENT DOCUMENTS 6,310,814 B1 10/2001 Hampel et al.
6,434,081 B1 8/2002 Johnson et al.
(Continued)

OTHER PUBLICATIONS

J. Huang and R. Liu, "DI-SSD: Desymmetrized Interconnection Architecture and Dynamic Timing Calibration for Solid-State Drives", 2018 23rd Asia and South Pacific Design Automation Conference (ASP-DAC), 2018, pp. 34-39 (Year: 2018).*

(Continued)

*Primary Examiner* — Daniel C. Chappell
(74) *Attorney, Agent, or Firm* — Kowert Hood Munyon Rankin and Goetzel PC; Rory D. Rankin (57) ABSTRACT

Systems, methods and mechanisms for efficiently calibrating memory signals. In various embodiments, a computing system includes at least one processor, a memory and a power manager. The power manager generates and sends updated power-performance states (p-states) to the processor and the memory. Logic within a memory controller for the memory initializes a first timer corresponding to a first p-state of the multiple p-states to indicate a duration for skipping memory calibration. The logic continues to update the first timer while transferring data with the memory using operating parameters of the first p-state. When the memory is not using operating parameters of the first p-state, the logic prevents updates of the first timer. When the power manager determines to transition the memory from the first p-state to a second p-state, and the second timer for the second e-state has not expired, the logic prevents calibration of the memory.

20 Claims, 9 Drawing Sheets

(51) Int. Cl.
*G11C 11/4063* (2006.01)
*G11C 7/10* (2006.01)

(52) U.S. Cl.
CPC ............ *G11C 7/22* (2013.01); *G11C 11/4063* (2013.01); *G11C 7/1048* (2013.01); *G11C 2207/2254* (2013.01)

(58) Field of Classification Search
CPC ........... G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2003/0691–0698; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G11B 20/00–24; G11C 7/00–24; G11C 11/00–5692; G11C 13/00–06; G11C 14/00–009; G11C 15/00–06; G11C 16/00–3495; G11C 17/00–18; G11C 2207/00–229; G11C 2216/00–30
See application file for complete search history.

(56) References Cited

U.S. PATENT DOCUMENTS

| | | | |
|---|---|---|---|
| 6,704,821 B2 | 3/2004 | Scandurra et al. | |
| 6,931,559 B2 | 8/2005 | Burns et al. | |
| 6,958,613 B2 * | 10/2005 | Braun | G06F 11/24 |
| | | | 324/601 |
| 7,036,053 B2 | 4/2006 | Zumkehr et al. | |
| 7,064,994 B1 * | 6/2006 | Wu | G06F 1/206 |
| | | | 365/211 |
| 7,162,376 B2 | 1/2007 | Oh et al. | |
| 7,405,984 B2 | 7/2008 | Hughes | |
| 7,467,255 B2 * | 12/2008 | Huang | G06F 13/1694 |
| | | | 711/105 |
| 7,652,932 B2 | 1/2010 | Millar et al. | |
| 7,698,589 B2 * | 4/2010 | Huang | G06F 5/06 |
| | | | 713/401 |
| 8,228,747 B2 | 7/2012 | Onishi | |
| 8,233,336 B2 | 7/2012 | Mueller | |
| 8,452,919 B2 | 5/2013 | Kim et al. | |
| 8,582,374 B2 | 11/2013 | Mozak et al. | |
| 8,588,014 B1 | 11/2013 | Fung et al. | |
| 8,630,131 B1 | 1/2014 | Shiao et al. | |
| 8,667,347 B2 | 3/2014 | Zerbe et al. | |
| 8,775,725 B2 * | 7/2014 | Bains | G11C 11/40611 |
| | | | 711/106 |
| 8,947,140 B2 | 2/2015 | Iyer et al. | |
| 8,949,520 B2 | 2/2015 | Ware et al. | |
| 9,043,539 B2 * | 5/2015 | Kaiwa | G11C 7/20 |
| | | | 711/106 |
| 9,104,421 B2 * | 8/2015 | Ahmad | G06F 1/3275 |
| 9,209,961 B1 | 12/2015 | Notani | |
| 9,286,961 B1 | 3/2016 | Jeter et al. | |
| 9,305,622 B1 | 4/2016 | Jeter | |
| 9,396,778 B1 | 7/2016 | Jeter et al. | |
| 9,401,189 B1 | 7/2016 | Ding et al. | |
| 9,425,778 B2 | 8/2016 | Lee et al. | |
| 9,436,387 B2 | 9/2016 | Jeter | |
| 9,477,259 B2 | 10/2016 | Jeter et al. | |
| 9,558,850 B1 | 1/2017 | Bialas, Jr. et al. | |
| 9,620,184 B1 | 4/2017 | Bialas, Jr. et al. | |
| 9,627,030 B1 | 4/2017 | Bialas, Jr. et al. | |
| 9,728,246 B2 | 8/2017 | Fujishiro | |
| 9,928,890 B2 | 3/2018 | Jeter et al. | |
| 9,990,973 B1 * | 6/2018 | Jeter | G06F 13/42 |
| 10,037,073 B1 * | 7/2018 | Catovic | G06F 3/3228 |
| 10,082,823 B1 | 9/2018 | Chang et al. | |
| 10,083,736 B1 | 9/2018 | Jeter et al. | |
| 10,090,028 B2 * | 10/2018 | Sato | G06F 13/1636 |
| 10,110,210 B2 | 10/2018 | Bandi et al. | |
| 10,242,723 B1 | 3/2019 | Jeter et al. | |
| 10,270,429 B1 | 4/2019 | Wang et al. | |
| 10,636,383 B2 * | 4/2020 | Zhang | G09G 5/10 |
| 10,872,652 B2 | 12/2020 | Notani et al. | |
| 2003/0081483 A1 * | 5/2003 | Paor | G11C 7/1018 |
| | | | 365/222 |
| 2003/0154416 A1 | 8/2003 | LaBerge | |
| 2003/0204669 A1 * | 10/2003 | Ranganathan | G06F 13/1636 |
| | | | 711/106 |
| 2004/0123207 A1 | 6/2004 | Zumkehr et al. | |
| 2005/0235102 A1 * | 10/2005 | Sakurai | G06F 13/1636 |
| | | | 711/106 |
| 2006/0100806 A1 * | 5/2006 | Zayas | G11B 20/10009 |
| | | | 702/85 |
| 2006/0104137 A1 * | 5/2006 | Bellows | G11C 11/4072 |
| | | | 365/222 |
| 2006/0164909 A1 | 7/2006 | Gower et al. | |
| 2007/0183243 A1 * | 8/2007 | Tanaka | G11C 11/406 |
| | | | 365/222 |
| 2007/0226529 A1 | 9/2007 | Huang | |
| 2007/0288182 A1 | 12/2007 | Douriet et al. | |
| 2008/0007319 A1 * | 1/2008 | Cox | G06F 1/32 |
| | | | 327/512 |
| 2008/0068911 A1 | 3/2008 | Hughes et al. | |
| 2008/0094918 A1 | 4/2008 | Fujizoe | |
| 2008/0140923 A1 * | 6/2008 | Bellows | G11C 7/20 |
| | | | 711/106 |
| 2008/0276133 A1 | 11/2008 | Hadley et al. | |
| 2009/0034344 A1 | 2/2009 | Nguyen et al. | |
| 2009/0244996 A1 | 10/2009 | Searles et al. | |
| 2009/0289659 A1 * | 11/2009 | Kuwahara | G11C 29/022 |
| | | | 326/30 |
| 2010/0329276 A1 | 12/2010 | Wang et al. | |
| 2011/0075496 A1 | 3/2011 | Mueller | |
| 2011/0119439 A1 * | 5/2011 | Blackmon | G11C 11/40611 |
| | | | 711/105 |
| 2011/0238870 A1 * | 9/2011 | Ware | G11C 29/48 |
| | | | 710/35 |
| 2011/0249522 A1 | 10/2011 | Welker et al. | |
| 2012/0005515 A1 | 1/2012 | Reddi et al. | |
| 2012/0151247 A1 | 6/2012 | Ferraiolo et al. | |
| 2012/0159230 A1 * | 6/2012 | Chen | G06F 1/324 |
| | | | 713/600 |
| 2012/0166839 A1 | 6/2012 | Sodhi et al. | |
| 2012/0300570 A1 | 11/2012 | Kim et al. | |
| 2012/0331220 A1 | 12/2012 | Bains | |
| 2013/0064025 A1 | 3/2013 | Chen et al. | |
| 2013/0070363 A1 | 3/2013 | Bennett et al. | |
| 2013/0076425 A1 | 3/2013 | Oh et al. | |
| 2014/0019792 A1 | 1/2014 | Oh et al. | |
| 2014/0181429 A1 | 6/2014 | Malladi et al. | |
| 2014/0229666 A1 | 8/2014 | Schoenborn et al. | |
| 2015/0169443 A1 * | 6/2015 | Lee | G06F 12/0246 |
| | | | 711/103 |
| 2016/0034219 A1 * | 2/2016 | Jeter | G06F 3/0683 |
| | | | 711/154 |
| 2016/0035411 A1 | 2/2016 | Yu et al. | |
| 2016/0048334 A1 | 2/2016 | Jeter | |
| 2016/0064066 A1 | 3/2016 | Ware et al. | |
| 2016/0118103 A1 | 4/2016 | Iijima | |
| 2016/0209866 A1 | 7/2016 | Jeter et al. | |
| 2016/0292094 A1 | 10/2016 | Jeter et al. | |
| 2016/0351246 A1 | 12/2016 | Fujishiro | |
| 2017/0017274 A1 | 1/2017 | Connolly | |
| 2017/0236569 A1 * | 8/2017 | Sato | G11C 11/40603 |
| | | | 711/106 |
| 2018/0046389 A1 | 2/2018 | Park et al. | |
| 2018/0181334 A1 * | 6/2018 | Radjai | G06F 13/1668 |

(56) References Cited

U.S. PATENT DOCUMENTS

2019/0187189 A1* 6/2019 Jeter ................ G01R 19/16566
2020/0286567 A1* 9/2020 Liikanen ............. G11C 11/5642

OTHER PUBLICATIONS

Self-Calibrating Memory Controllers; William G. Wong, ElectronicDesign; May 16, 2011; retrieved from https://www.electronicdesign.com/technologies/boards/article/21799302/selfcalibrating-memory-controllers on Jul. 2, 2021 (Year: 2011).*
International Search Report and Written Opinion in International Application No. PCT/US2016/020197, dated Jun. 14, 2016, 13 pages.

* cited by examiner

FILTERING MEMORY CALIBRATION

BACKGROUND

Technical Field

Embodiments described herein relate to the field of computing systems and, more particularly, to efficiently calibrating memory signals.

Description of the Related Art

Generally speaking, a variety of computing systems include a processor and a memory. The processor generates access requests for instructions and application data while processing one or more software applications. When fetching instructions and data, the processor checks a hierarchy of local cache memories and, if not found, the processor issues requests for the desired instructions and data to system memory. The system memory is typically implemented as one of a variety of types of off-chip dynamic random access memory (DRAM). When requested data is not stored in the system memory, then the memory controller for the DRAM forwards the requests to main memory implemented with one or more of a hard disk drive, a solid-state drive, and so forth.

Accessing data in the system memory, such as DRAM, is a complex process with many behind-the-scenes steps performed by the memory controller. For example, the memory controller determines when to change from sending read operations to sending write operations, and thus, direct the off-chip data bus to turn around and drive data in the opposite direction. The memory controller also schedules requests and responses based on a variety of criteria, each with a given priority. In addition, the internal processes of the memory of the DRAM is complex with activation/open transactions, column access transactions, read access transactions, write access transactions, and precharge/close transactions.

In order to ensure the multiple DRAM transactions perform reliably over time, the memory controller initiates periodic calibration of the DRAM. These calibration processes are needed to fine-tune various parameters to optimize performance and functionality of the DRAM at a target clock frequency. Examples of the periodic calibration processes are ZQ calibration that tunes the on-die termination (ODT) resistances, write leveling calibration, data strobe signal (DQS) gating calibration, write data DQS calibration, read data DQS calibration, write data bit delay calibration to determine the additional delay for each output data bit, read data bit delay calibration to determine the additional delay for each input data bit, and so on.

In addition, computing systems typically include control logic, such as a power management unit, for determining one or more power-performance states (p-states) for the different functional units in the system. Each of the multiple p-states includes a power supply voltage and an operational clock frequency. Clock generating circuitry generates different clock signals at the one or more specified different frequencies, whereas a power distribution network provides the one or more specified different power supply voltages. To reduce power consumption, the power management unit changes the p-states of the functional units including the memory. However, calibration of the DRAM is dependent on the operational clock frequency. Each time the operational clock frequency is changed, one or more of the various calibration processes are repeated. The calibration processes also consumes power. As the frequency of the changes to the p-states increase, the amount of power consumed by the calibration processes also increase.

In view of the above, efficient systems, methods and mechanisms for calibrating memory signals are desired.

SUMMARY

Systems, methods and mechanisms for efficiently calibrating memory signals are contemplated. In various embodiments, a computing system includes at least one processor, a memory and a power manager. The processor generates memory requests and the memory stores data requested by the processor. The power manager generates and sends updated power-performance states (p-states) to the processor and the memory. In some embodiments, a memory controller for the memory maintains a first timer corresponding to a first p-state of the multiple p-states. In other embodiments, the memory controller maintains a respective timer for two or more p-states of the multiple p-states. In yet other embodiments, the memory controller maintains a respective timer for each of the multiple p-states. Each of the multiple p-states includes operating parameters such as a power supply voltage and an operational clock frequency. In an embodiment, the memory controller initializes the first timer to indicate a duration for skipping memory calibration. As used herein, "a duration for skipping memory calibration" refers to a duration during which memory calibration is not to be performed. In various designs, the memory controller selects a duration greater than a time period between updates of the p-states from the power manager.

In various embodiments, the memory controller continues to update the first timer while transferring data with the memory using operating parameters of the first p-state. In some designs, the memory controller decrements the timer during each clock cycle from a first value to a second value while transferring data with the memory using operating parameters of the first p-state. In some examples, the first value is a count of clock cycles equivalent to the desired duration for skipping memory calibration and the second value is zero. In other designs, the memory controller increments the timer during each clock cycle from the first value to the second value while transferring data with the memory using operating parameters of the first p-state. In some examples, the first value is zero and the second value is the count of clock cycles equivalent to the desired duration for skipping memory calibration. Similarly, in various designs, the memory controller continues to update a second timer while transferring data with the memory using operating parameters of the second p-state. When the memory is not using operating parameters of the first p-state, the memory controller prevents updates of the first timer. For example, the memory controller no longer decrements or increments the first timer.

When the memory controller receives an indication to transition the memory from the first p-state to the second p-state, the memory controller inspects the second timer of the second p-state. If the second timer has not expired, then the memory controller prevents calibration of the memory. Therefore, memory is not calibrated for each change of the operating parameters associated with p-state changes. In an embodiment, the memory controller conveys an indication to one or more agents that a latency for the transition to the second p-state for the memory does not include an added latency for memory calibration. Therefore, the agents are able to adjust a number of requests to store in queues while waiting for the p-state change to complete.

If the second timer expires while the memory uses operating parameters of the second p-state, then the memory controller performs one or more memory calibration processes. When the memory calibration processes complete, the memory controller resets the second timer to the desired duration for skipping memory calibration. If the memory continues to use the operating parameters of the second p-state, then the memory controller continues to update the second timer such as incrementing or decrementing the second timer.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
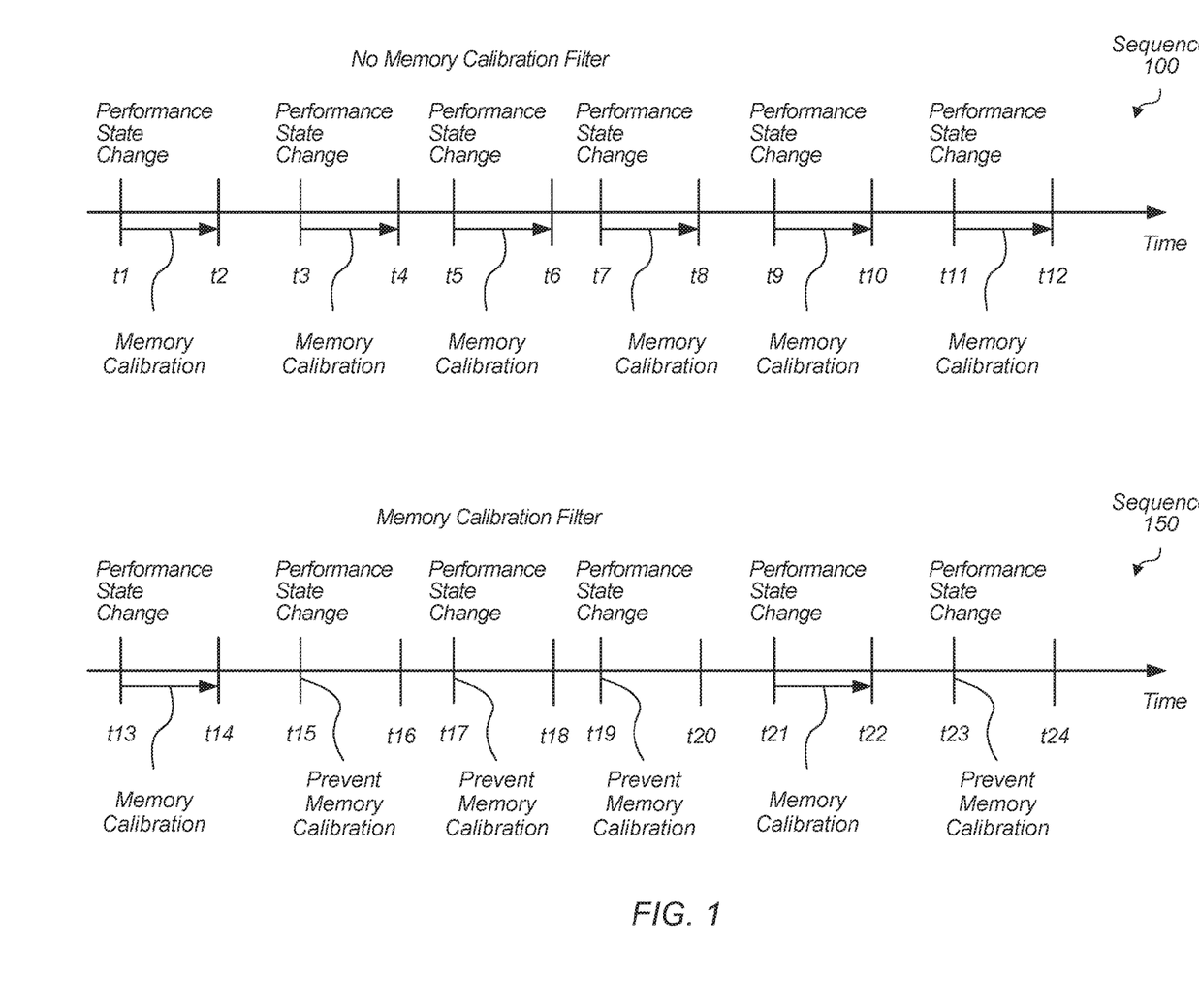
FIG. 1 is a block diagram of one embodiment of sequences for handling memory calibration with transitions of power-performance states.

Turning to FIG. 1, a generalized block diagram of one embodiment of sequences 100 and 150 for handling memory calibration with transitions of power-performance states in a computing system is shown. As shown, sequence 100 includes multiple points in time from time t1 to time t12 indicating when performance state changes occur. The performance state changes are equivalent to changes in the operating parameters of power-performance states (p-states). Each of the multiple p-states includes operating parameters such as a power supply voltage and an operational clock frequency. Clock generating circuitry generates different clock signals at the one or more specified different frequencies, whereas a power distribution network provides the one or more specified different power supply voltages. To reduce power consumption, a power management unit changes the p-states of functional units in a computing system including a memory. In various designs, the memory is system memory, which is typically implemented as one of a variety of types of off-chip dynamic random access memory (DRAM).

At the first point in time t1, or simply time t1, a power management unit, which is also referred to as a power manager, sends an indication of a p-state change to the memory. From time t1 to time t2, control logic in one or more of the memory controller and the memory changes the operating parameters of the memory to the operating parameters of the new p-state. In addition, the control logic in one or more of the memory controller and the memory perform one or more memory calibration processes. Some of the memory calibration processes are performed simultaneously as the operating parameter are changing. Other memory calibrations processes wait until the changes for the operating parameters complete before beginning. Examples of the periodic calibration processes are ZQ calibration that tunes the on-die termination (ODT) resistances, write leveling calibration, data strobe signal (DQS) gating calibration, write data DQS calibration, read data DQS calibration, write data bit delay calibration to determine the additional delay for each output data bit, read data bit delay calibration to determine the additional delay for each input data bit, and so on.

Although the power manager changes p-states for the computing system for reducing power consumption when possible, the memory calibration processes also consume power. As shown, the power manager sends performance state changes to the memory at times t3, t5, t7, t9 and t11. At each of these points in time, one or more memory calibration processes are also performed, and accordingly, power is consumed. Reducing the frequency of performing the memory calibration processes also further reduces power consumption of the computing system.

As shown, sequence 150 includes multiple points in time from time t13 to time t24 indicating when performance state changes occur and when memory calibrations processes are prevented. At time t13, a power manager sends an indication of a p-state change to the memory. From time t13 to time t14, one or more memory calibration processes are also performed, and accordingly, power is consumed. At time t15, the power manager again sends an indication of a p-state change to the memory. However, each of the memory calibration processes is prevented from being performed. Therefore, no additional power is consumed for the memory calibration processes. Similarly, at times t17, t19 and t23, the power manager sends performance state changes to the memory. However, in various designs, logic in the memory controller prevents performing each of the memory calibration processes.

When comparing the sequence of events of sequence 150 from times t13 to t24 to the sequence of events of sequence 100 from times t1 to t12, the power consumption for sequence 150 is less than the power consumption for sequence 100. Adding logic for determining when to prevent performing memory calibration processes for each performance state change reduces the system's power consumption while supporting frequent p-state changes.

Figure 2:
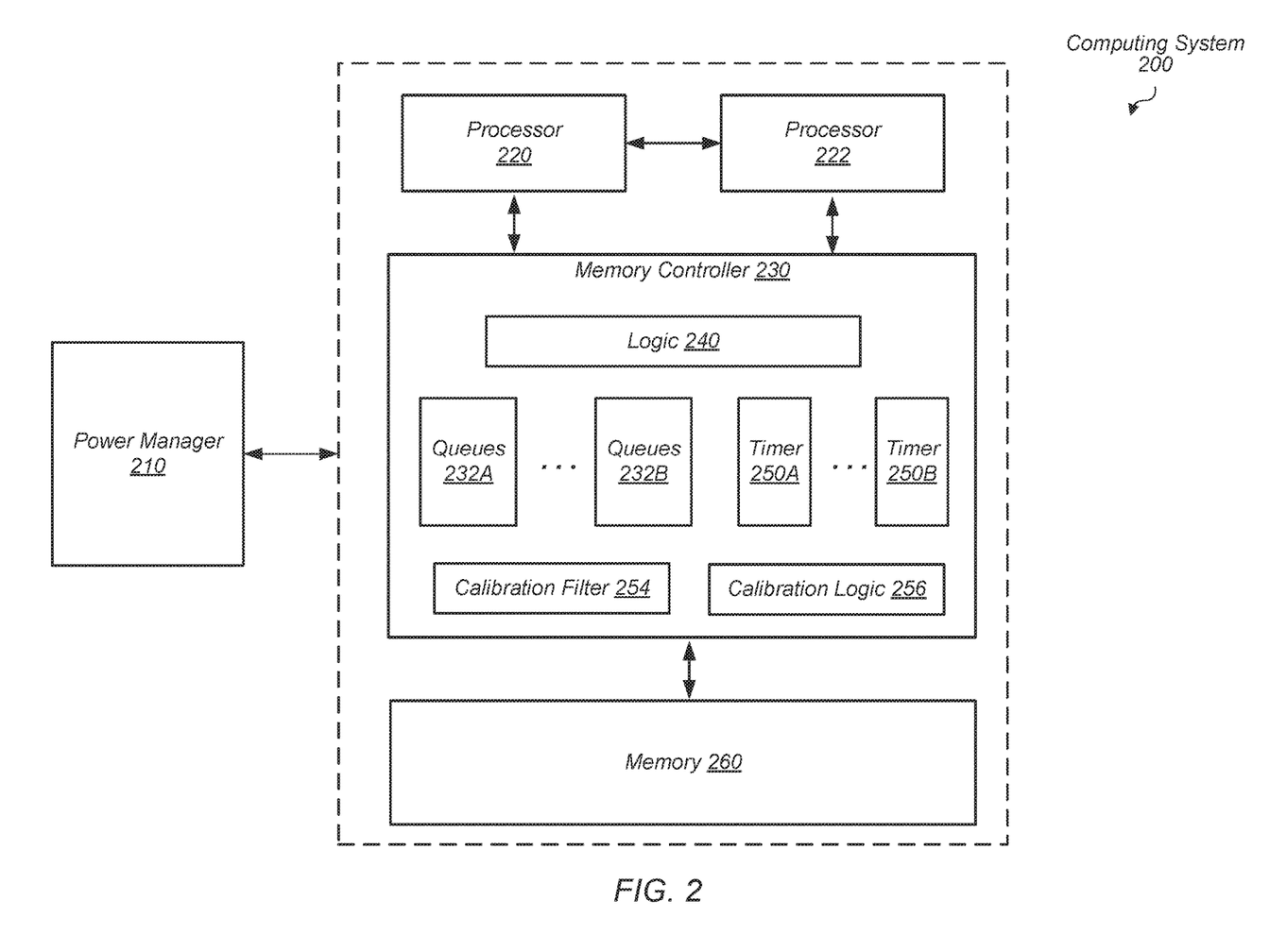
FIG. 2 is a block diagram of one embodiment of a computing system.

Turning to FIG. 2, a generalized block diagram of one embodiment of a computing system 200 is shown. In the illustrated embodiment, a power manager 210 transfers information between multiple components such as processors 220 and 222, memory controller 230 and memory 260. In various designs, the processors 220 and 222 transfer messages and data to one another and power manager 210. In addition, the processors 220 and 222 transfer messages and data to memory 260 via the memory controller 230. In various designs, the components of computing system 200 utilize a communication fabric (not shown) for the transferring of information. Although only two processors are shown, in other embodiments, another number of processors are in the computing system 200. Similarly, in other embodiments, the computing system 200 includes other components such as an input/output (I/O) interface and other types of processing units such as a multimedia engine, a camera and so on.

The power manager 210 receives feedback information from the other components of the computing system 200. For example, in some designs, the power manager 210 receives measurements from one or more on-die temperature sensors and one or more power supply sensors, which are not shown for ease of illustration. Additionally, in some designs, the power manager receives an indication of an activity level of the other components. For example, one or more of the memory controller 230 and the processors 220 and 222 send an indication of an activity level based on a predetermined range. Alternatively, the components send a weighted sum of sampled signals. In some designs, one or more of clock enable signals routed to local clock distribution blocks, cache access hit/miss status, bus driver enable signals and so on are examples of signals chosen to be sampled. The power manager 210 processes the received feedback information and adjusts the operating parameters of one or more of the components of computing system 200. For example, the power manager 210 sends an updated p-state to one or more of the components.

Each of the processors 220 and 222 include one or more processor cores and use local storage such as a cache memory subsystem. When the processor cores do not find requested data in local storage, the processor cores generate memory requests and send them to the memory 260 via the memory controller 230. Examples of the processors 220 and 222 are a general-purpose central processing unit (CPU), a processor with single instruction multiple data (SIMD) cores, such as a graphics processing unit (GPU), a digital signal processor (DSP), and so forth. In various designs, the memory 260 is implemented as one of a variety of types of off-chip dynamic random access memory (DRAM). When requested data is not stored in the memory 260, then the memory controller 230 forwards the requests to main memory implemented with one or more of a hard disk drive, a solid-state drive, and so forth.

The memory controller 230 includes queues 232A-232B for storing memory requests received from the processors 220 and 222. In addition, one or more of the queues 232A-232B store memory responses received from the memory 260. The memory responses include requested read data and write acknowledgments. Logic 240 routes the requests and the responses to the appropriate one of the queues 232A-232B. Logic 240 also schedules the requests and responses to be deallocated from the queues 232A-232B based on one of a variety of arbitration schemes.

The memory controller 230 also includes calibration logic 256 for initiating and/or performing one or more memory calibration processes for the memory 260. In various embodiments, calibration filter 254 determines when to prevent calibration of the memory 260. For example, in an embodiment, calibration filter 254 maintains the timers 250A-250B, and prevents memory calibration during particular events. In one embodiment, the calibration filter 254 maintains a separate timer of the timers 250A-250B for each of the available p-states. In an embodiment, the calibration filter 254 initializes the timers 250A-250B to indicate a duration during which memory calibration is not to be performed. In various designs, the calibration filter 254 selects a duration greater than a time period between updates of the p-states from the power manager 210. In one example, the power manager sends updates of p-states every 50 microseconds to every 20 milliseconds, and the calibration filter 254 initializes the timers 250A-250B with a value of 200 milliseconds. In an example, the timers 250A-250B are counters, and the initial value is a count of clock cycles that provides an equivalent duration of time as the selected 200 milliseconds.

The calibration filter 254 continues to update a first timer of the timers 250A-250B while the memory controller 230 transfers data with the memory 260 using operating parameters of the first p-state corresponding to the first timer. In some designs, the calibration filter 254 updates the first timer by decrementing the first timer during each clock cycle from a first value to a second value while the memory 260 uses the operating parameters of the first p-state. In some examples, the first value is a count of clock cycles equivalent to the desired duration for skipping memory calibration and the second value is zero. As described earlier, "a duration for skipping memory calibration" refers to a duration during which memory calibration is not to be performed. In other designs, the calibration filter 254 updates the first timer by incrementing the first timer during each clock cycle from the first value to the second value while the memory 260 uses the operating parameters of the first p-state. In some examples, the first value is zero and the second value is the count of clock cycles equivalent to the desired duration for skipping memory calibration.

Similarly, in various designs, the calibration filter 254 continues to update a second timer while the memory 260 uses the operating parameters of the first p-state. When the memory 260 is not using operating parameters of the first p-state, the calibration filter 254 prevents updates of the first timer. For example, the calibration filter 254 no longer decrements or increments the first timer. When the first timer expires, the calibration filter 254 does not update the first timer until the calibration filter 254 receives an indication from the calibration logic 256 that memory calibration eventually completed while the memory 260 uses the operation parameters of the first p-state.

When the memory controller 230 receives an indication from the power manager 210 to transition the memory 260 from the first p-state to the second p-state, the calibration filter 254 inspects the second timer of the second p-state. If the second timer has not expired, then the calibration filter 254 prevents calibration of the memory 260. For example, the calibration filter 254 sends an indication to the calibration logic 256 to halt any of the memory calibration processes. Therefore, the memory 260 is not calibrated for each change of the operating parameters associated with p-state changes. In an embodiment, the memory controller 230 conveys an indication to one or more of the processors 220 and 222 that a latency for the transition to the second p-state for the memory 260 does not include an added latency for memory calibration. Therefore, one or more of the processors 220 and 222 are able to adjust a number of requests to store in queues while waiting for the p-state change to complete for the memory 260. For example, when one or more of the processors 220 and 222 execute real-time applications, the knowledge of the reduced latency improves performance.

It is noted that clock sources, such as phase lock loops (PLLs), interrupt controllers, and so forth are not shown in FIG. 2 for ease of illustration. It is also noted that the number of components of the computing system 200 (and the number of subcomponents for those shown in FIG. 2, such as within the memory controller 230) may vary from embodiment to embodiment. It is also noted that the functionality of the subcomponents in the memory controller 230 is implemented with hardware, such as circuitry, by software, or by a combination of hardware and software.

Figure 3:
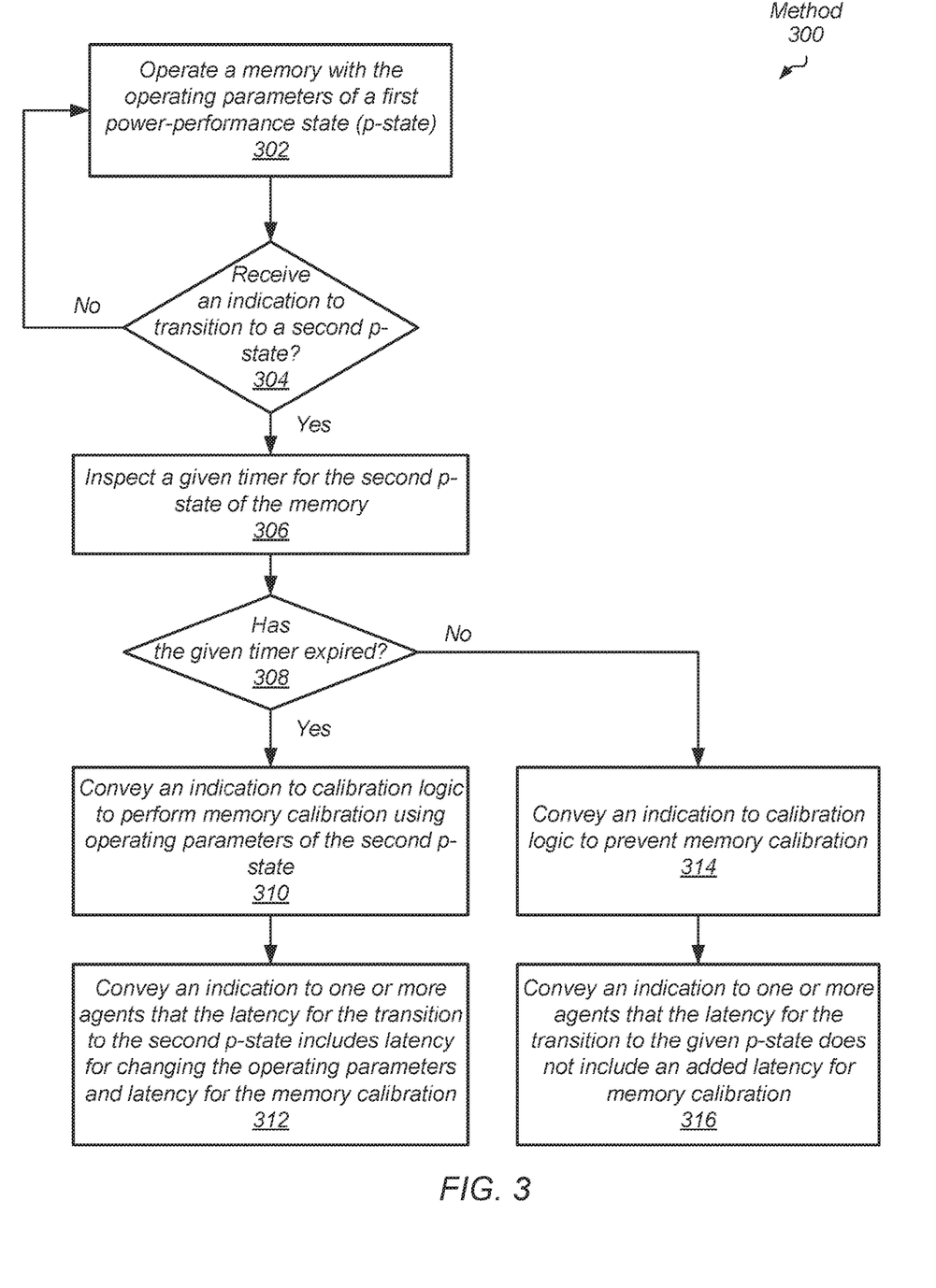
FIG. 3 is a flow diagram of one embodiment of a method for efficiently handling memory calibration with transitions of power-performance states.

Turning now to FIG. 3, a generalized flow diagram of one embodiment of a method 300 for efficiently handling memory calibration with transitions of power-performance states is shown. For purposes of discussion, the steps in this embodiment (as well as for FIGS. 4-7) are shown in sequential order. However, in other embodiments some steps may occur in a different order than shown, some steps may be performed concurrently, some steps may be combined with other steps, and some steps may be absent.

A memory operates with the operating parameters of a first power-performance state (p-state) (block 302). In some embodiments, a computing system uses the memory as system memory, and the memory is implemented one of a variety of types of off-chip dynamic random access memory (DRAM). If logic within a corresponding memory controller receives an indication to transition to a second p-state ("yes" branch of the conditional block 304), then the logic inspects a given timer for the second p-state of the memory (block 306).

If the logic determines that the given timer has expired ("yes" block of the conditional block 308), then the logic conveys an indication to calibration logic to perform memory calibration using operating parameters of the second p-state (block 310). Following this, the logic conveys an indication to one or more agents that the latency for the transition to the second p-state includes latency for changing the operating parameters and latency for the memory calibration (block 312).

If the logic determines that the given timer has not expired ("no" block of the conditional block 308), then the logic conveys an indication to calibration logic to prevent memory calibration (block 314). Following this, the logic conveys an indication to one or more agents that the latency for the transition to the given p-state does not include an added latency for memory calibration (block 316). For example, when one or more of the agents execute real-time applications, the knowledge of the reduced latency improves performance. In various embodiments, the logic conveys this indication to the one or more agents after determining to prevent memory calibration and before the start of the p-state transition in the memory controller. Therefore, the one or more agents are capable of indicating to the memory controller that they have a sufficient amount of stored data to allow the memory, such as DRAM, to be unavailable while the p-state transition occurs.

Figure 4:
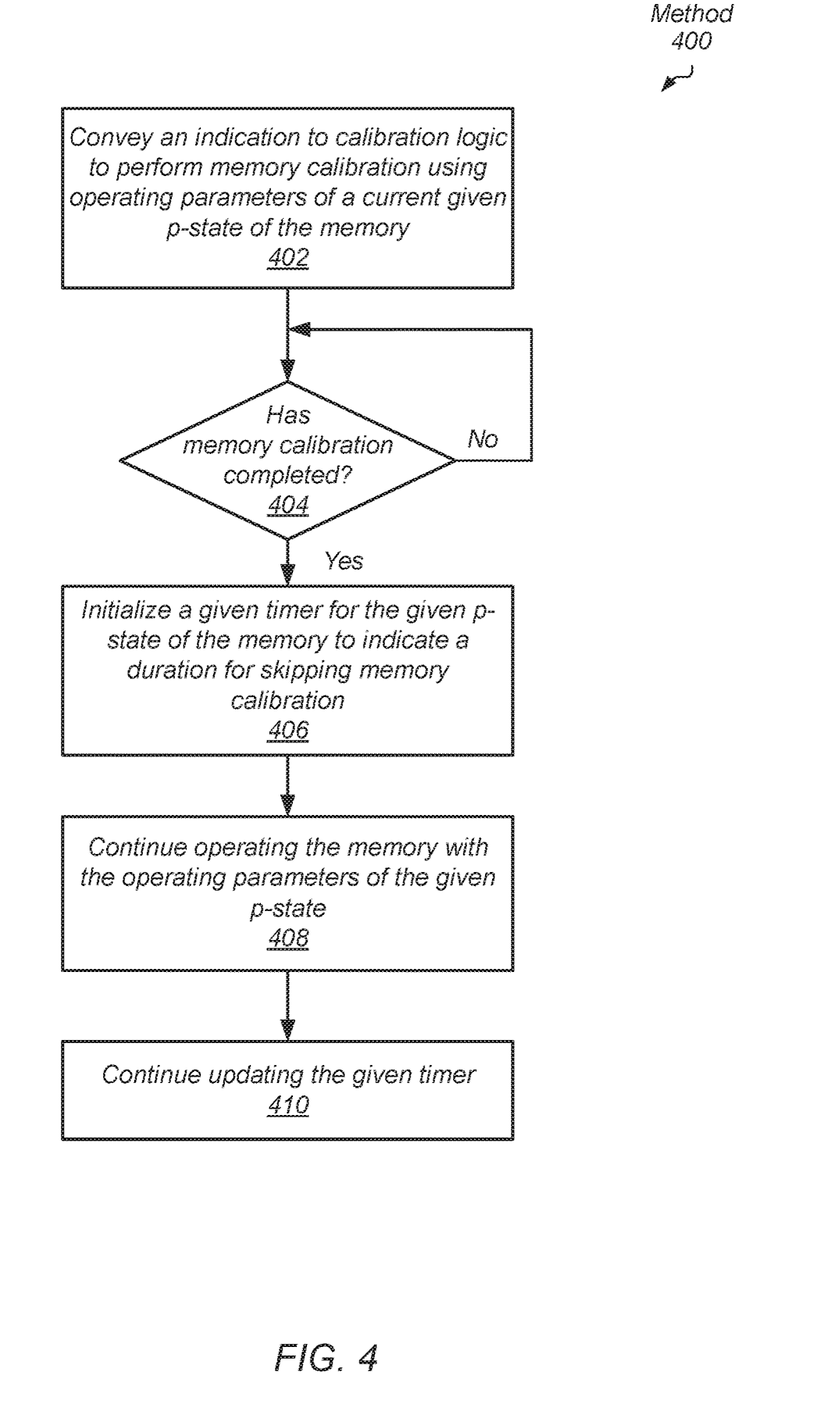
FIG. 4 is a flow diagram of one embodiment of a method for efficiently handling memory calibration with transitions of power-performance states.

Referring to FIG. 4, a generalized flow diagram of one embodiment of a method 400 for efficiently handling memory calibration with transitions of power-performance states is shown. Logic, such as logic within a memory controller, conveys an indication to calibration logic to perform memory calibration for a memory using operating parameters of a current given p-state of the memory (block 402). If the memory calibration has completed ("yes" branch of the conditional block 404), then the logic initializes a given timer for the given p-state of the memory to indicate a duration for skipping memory calibration (block 406). The logic continues operating the memory with the operating parameters of the given p-state (block 408). In addition, the logic continues updating the given timer (block 410).

Figure 5:
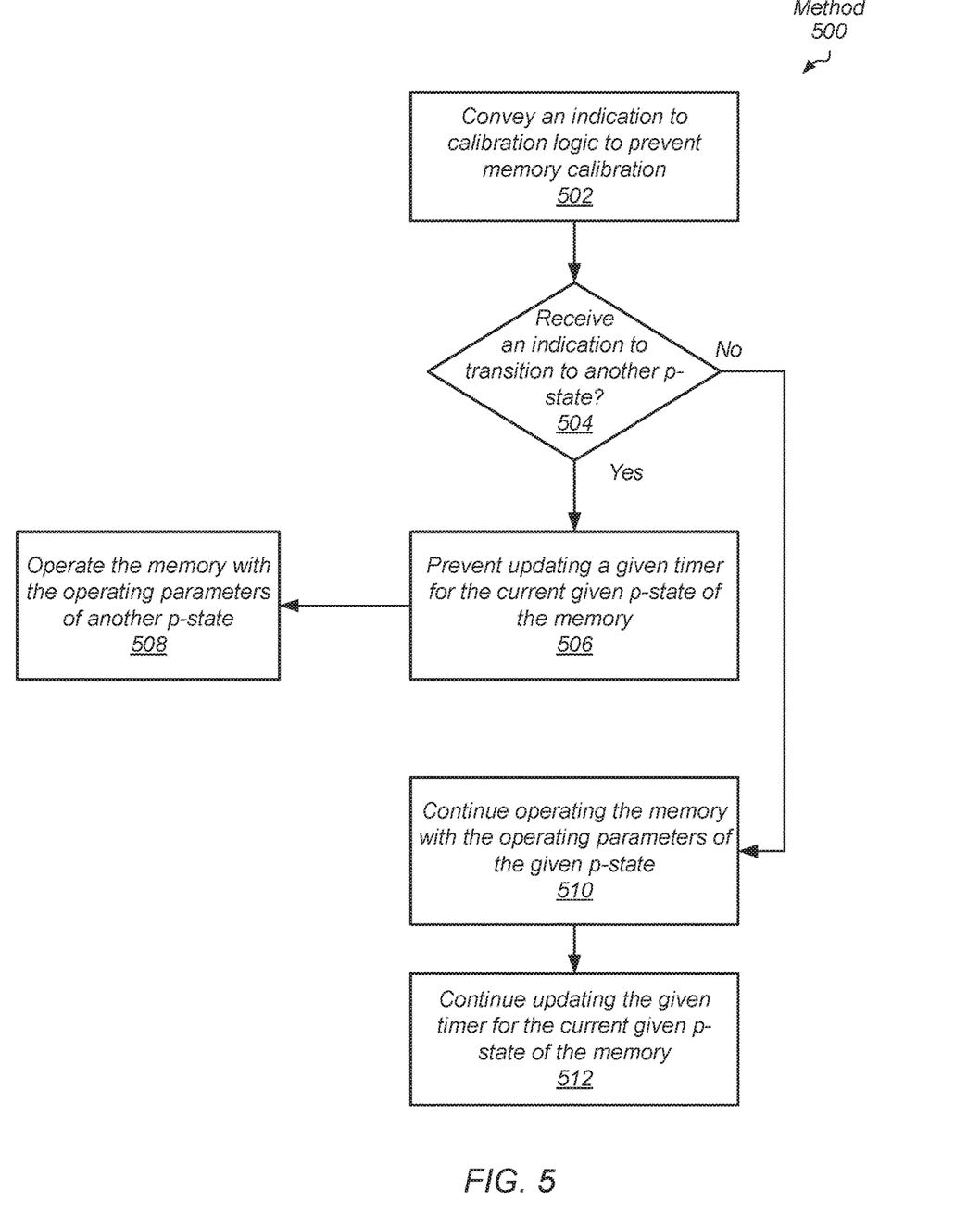
FIG. 5 is a flow diagram of one embodiment of a method for efficiently handling memory calibration with transitions of power-performance states.

Referring to FIG. 5, a generalized flow diagram of one embodiment of a method 500 for efficiently handling memory calibration with transitions of power-performance states is shown. Logic, such as logic within a memory controller, conveys an indication to calibration logic to prevent memory calibration of a memory (block 502). If the logic receives an indication to transition to another p-state ("yes" branch of the conditional block 504), then in some embodiments, the logic continues updating a given timer for the current given p-state of the memory (block 506) although another p-state will be used. In other embodiments, the logic prevents updating the given timer for the current given e-state of the memory since another p-state will be used. The logic operates the memory with the operating parameters of the other p-state specified in the received indication (block 508).

If the logic does not receive an indication to transition to another p-state ("no" branch of the conditional block 504), then the logic continues operating the memory with the operating parameters of the given p-state (block 510). The logic continues updating the given timer for the current given p-state of the memory (block 512).

Figure 6:
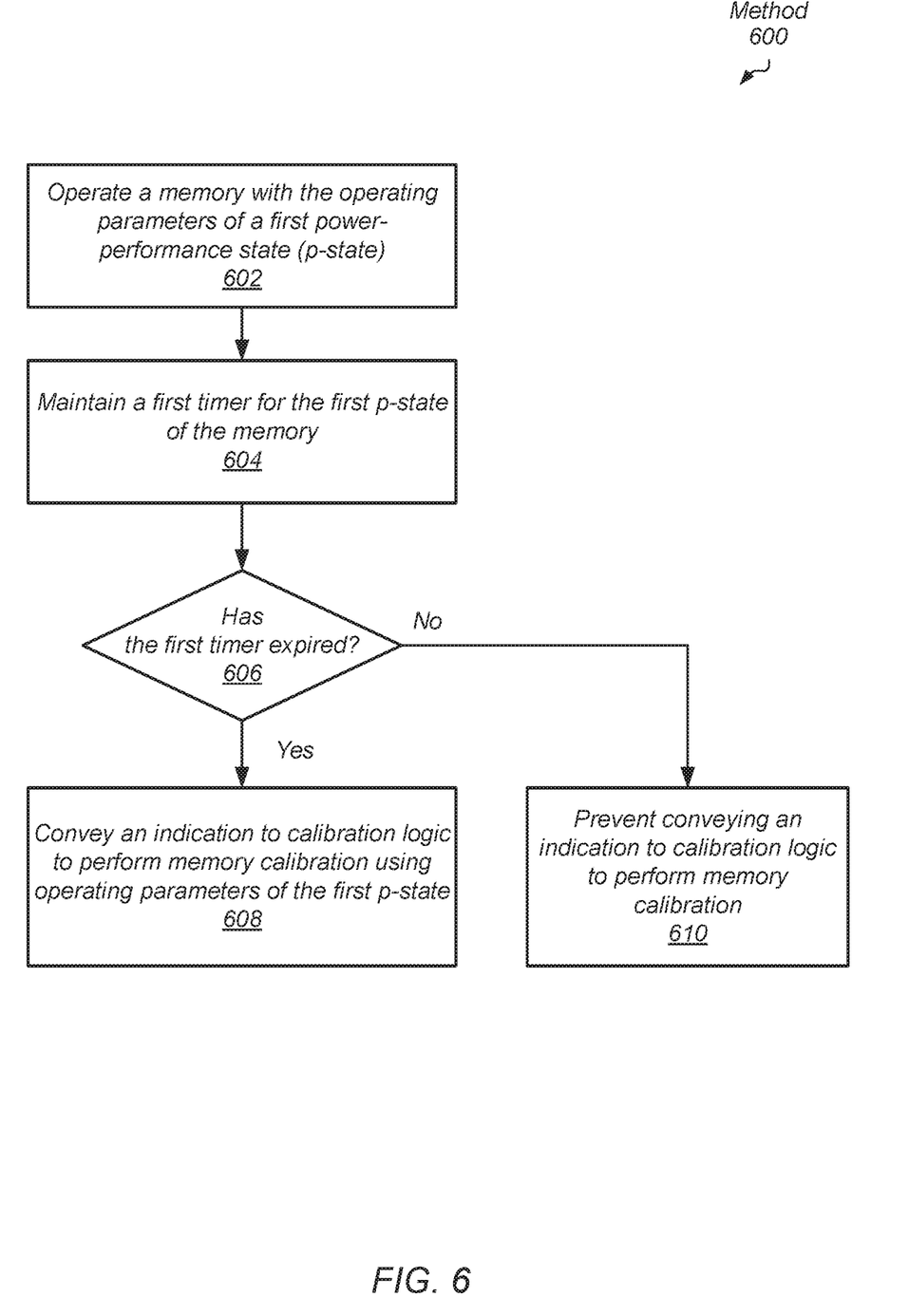
FIG. 6 is a flow diagram of one embodiment of a method for efficiently handling memory calibration with transitions of power-performance states.

Referring to FIG. 6, a generalized flow diagram of one embodiment of a method 600 for efficiently handling memory calibration with transitions of power-performance states is shown. A memory operates with the operating parameters of a first power-performance state (p-state) (block 602). In some embodiments, a computing system uses the memory as system memory, and the memory is implemented one of a variety of types of off-chip dynamic random access memory (DRAM). Logic, such as logic within a memory controller for the memory, maintains a first timer for the first p-state of the memory (block 604).

If the logic determines that the first timer has expired ("yes" block of the conditional block 606), then the logic conveys an indication to calibration logic to perform memory calibration using operating parameters of the first p-state (block 608). However, if the logic determines that the first timer has not expired ("no" block of the conditional block 606), then the logic prevents conveying an indication to calibration logic to perform memory calibration (block 610).

Figure 7:
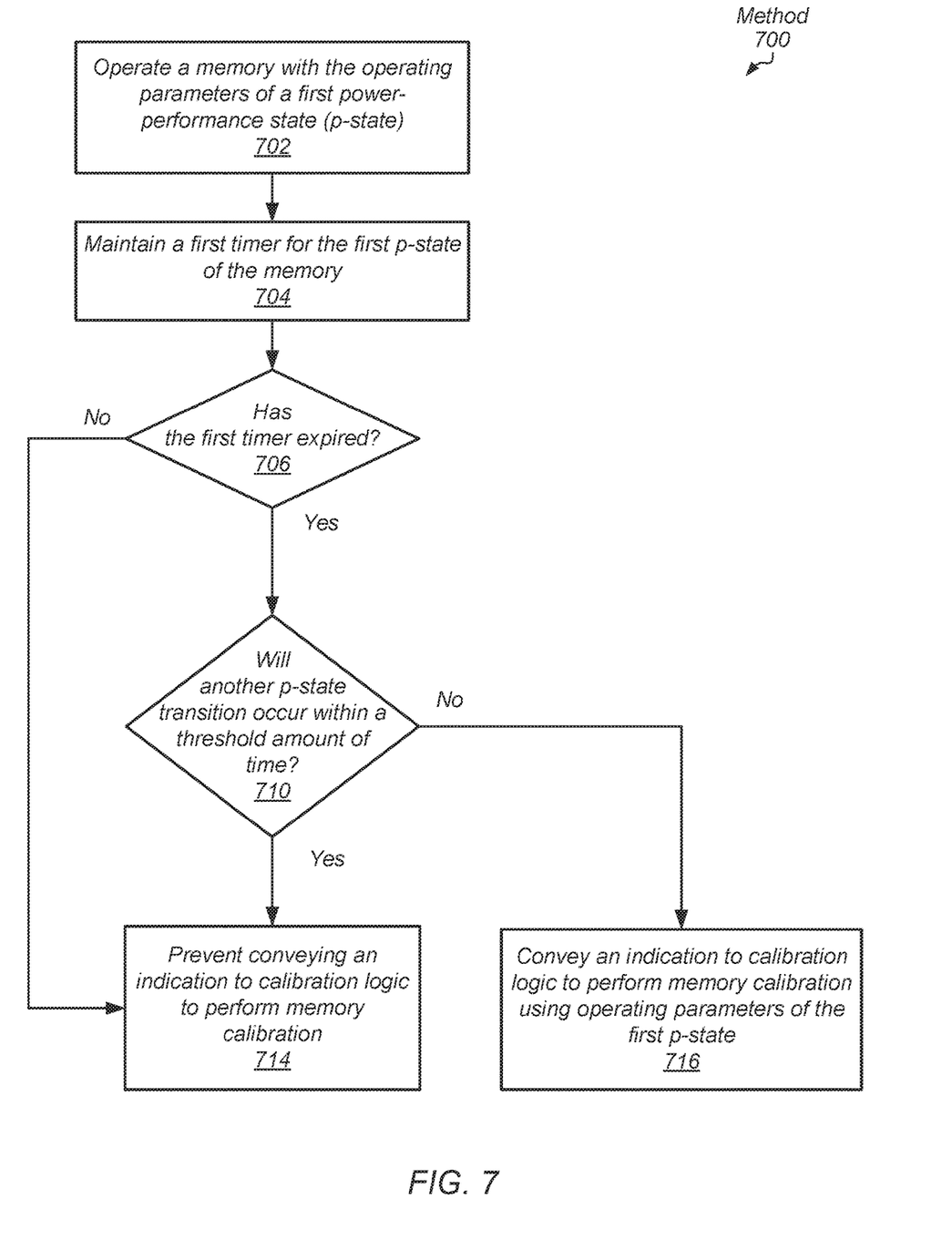
FIG. 7 is a flow diagram of one embodiment of a method for efficiently handling memory calibration with transitions of power-performance states.

Referring to FIG. 7, a generalized flow diagram of one embodiment of a method 700 for efficiently handling memory calibration with transitions of power-performance states is shown. A memory operates with the operating parameters of a first power-performance state (p-state) (block 702). Logic, such as logic within a memory controller for the memory, maintains a first timer for the first p-state of the memory (block 704). If the logic determines that the first timer has not expired ("no" block of the conditional block 706), then the logic prevents conveying an indication to calibration logic to perform memory calibration (block 714).

If the logic determines that the first timer has expired ("yes" block of the conditional block 706), and another p-state transition will occur within a threshold amount of time ("yes" block of the conditional block 710), then the logic prevents conveyance of an indication to calibration logic to perform memory calibration (block 714). Otherwise, if the logic determines that the first timer has expired ("yes" block of the conditional block 706) and another p-state transition will not occur within a threshold amount of time ("no" block of the conditional block 710), then the logic conveys an indication to calibration logic to perform memory calibration using operating parameters of the first p-state (block 716).

Figure 8:
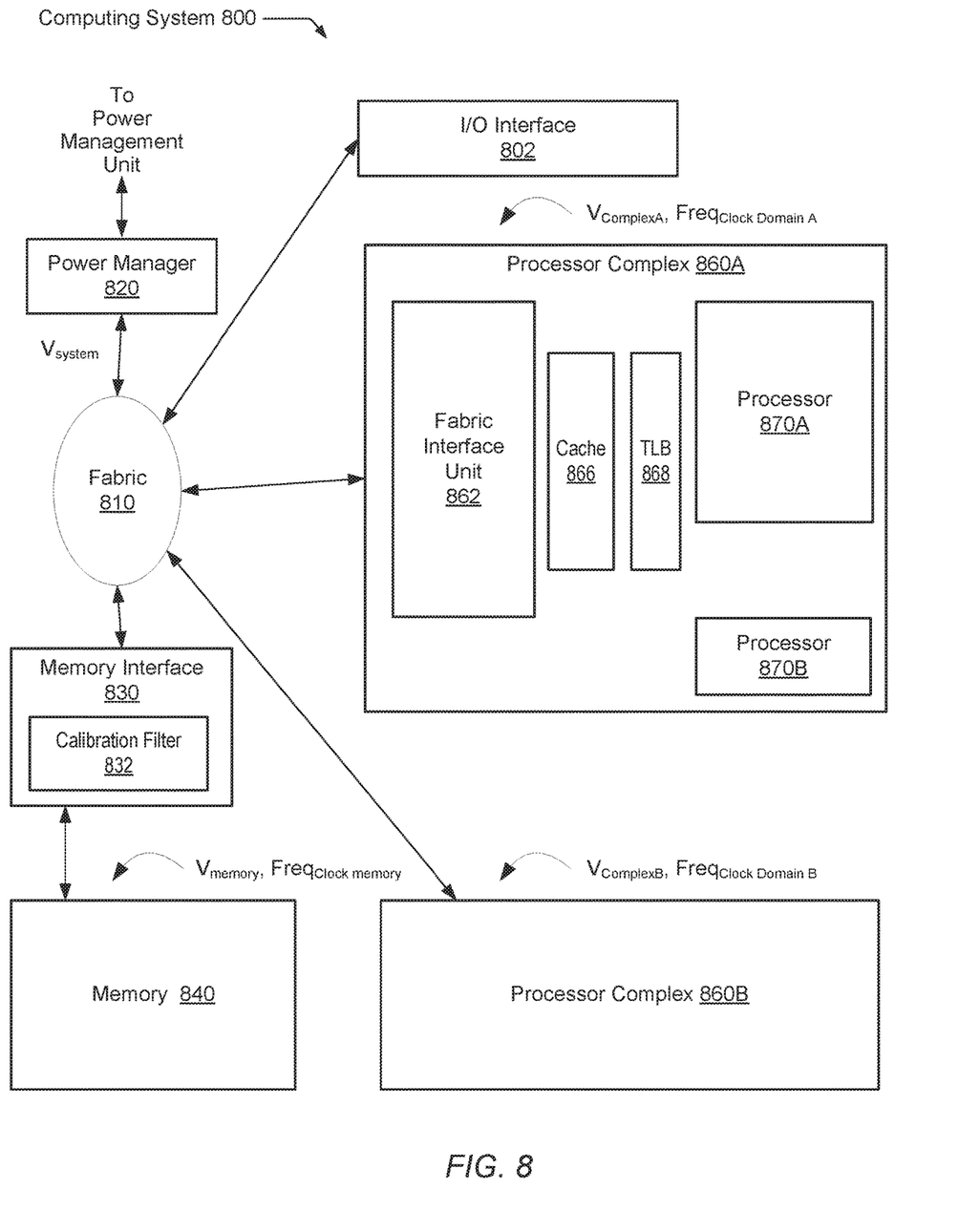
FIG. 8 is a block diagram of one embodiment of a computing system.

Turning now to FIG. 8, a generalized block diagram of one embodiment of a computing system 800 capable of efficiently handling memory calibration with transitions of power-performance states is shown. As shown, a communication fabric 810 routes data between the input/output (I/O) interface 802, the memory interface 830, the power manager 820 and the processor complexes 860A-860B. In various embodiments, the computing system 800 is a system on chip (SoC) that includes multiple types of integrated circuits on a single semiconductor die, each integrated circuit providing a separate functionality. In other embodiments, the multiple functional units are individual dies within a package, such as a multi-chip module (MCM). In yet other embodiments, the multiple functional units are individual dies or chips on a printed circuit board.

Clock sources, such as phase lock loops (PLLs), interrupt controllers, and so forth are not shown in FIG. 8 for ease of illustration. It is also noted that the number of components of the computing system 800 (and the number of subcomponents for those shown in FIG. 8, such as within each of the processor complexes 860A-860B) may vary from embodiment to embodiment. There may be more or fewer of each component/subcomponent than the number shown for the computing system 800. As described earlier, the term "processor complex" is used to denote a configuration of one or more processor cores using local storage, such as a shared cache memory subsystem, and capable of processing a workload together.

The power manager 820 controls the supply voltage magnitudes requested from the external power management unit. There may be multiple supply voltages generated by the external power management unit for the computing system 800. For example, in the illustrated embodiment, there is a supply voltage indicated as $V_{Complex}$ for each of the processor complexes 860A-860B, a supply voltage $V_{memory}$ for the memory 840, and a supply voltage $V_{System}$ for one or more other components in the computing system 800. There may be multiple supply voltages for the rest of the computing system 800, in some embodiments.

In some embodiments, logic local to various components may control the power states of the components, including power up and power down and various other power-performance states (p-states) and operating modes for those components that support more than one p-state and operating mode. In various embodiments, the p-state is used to determine the operational voltage and operational frequency used by a component, whereas the operating mode determines how many sub-components are powered up such as particular execution pipelines.

In various embodiments, each of the processor complexes 860A-860B and the memory 840 are capable of operating with a different supply voltage from a different power plane (e.g., $V_{ComplexA} \neq V_{ComplexB} \neq V_{memory}$). As shown, the processor complex 860A uses the voltage magnitude $V_{ComplexA}$ as an operational supply voltage and the clock frequency $F_{Clock\ Domain\ A}$ from a first clock domain. The processor complex 860B uses the voltage magnitude $V_{ComplexB}$ as an operational supply voltage and the clock frequency $F_{Clock\ Domain\ B}$ from a different, second clock domain. The memory 840 uses the voltage magnitude $V_{memory}$ as an operational supply voltage and the clock frequency $F_{Clock\ memory}$ from a different, third clock domain. In other embodiments, each of the processor complexes 860A-860B and the memory 840 operates with a same supply voltage (e.g., $V_{ComplexA} = V_{ComplexB} = V_{memory}$) from a single power plane while also operating with different clock frequencies source from different clock domains. In yet other embodiments, two or more of the processor complexes 860A-860B and the memory 840 operate with a same supply voltage and a same clock frequency while one other component operates with a different supply voltage or a different clock frequency.

In various embodiments, different types of data flow independently through the fabric 810. The independent flow is accomplished by allowing a single physical fabric bus to include a number of overlaying virtual channels, or dedicated source and destination buffers, each carrying a different type of data. Each channel is independently flow controlled with no dependence between transactions in different channels. The fabric 810 may also be packet-based, and may be hierarchical with bridges, cross bar, point-to-point, or other interconnects.

In some embodiments, the memory interface 830 uses at least one memory controller and at least one cache for the off-chip memory, such as synchronous DRAM (SDRAM). The memory interface 830 stores memory requests in request queues, uses any number of memory ports, and uses circuitry capable of interfacing to memory using one or more of a variety of protocols used to interface with memory channels used to interface to memory devices (not shown). The memory interface 830 may be responsible for the timing of the signals, for proper clocking to synchronous dynamic random access memory (SDRAM), on-die flash memory, etc. In various embodiments, the memory interface 830 also includes the calibration filter 832. In some embodiments, the functionality of the calibration filter 832 is equivalent to the functionality of the calibration filter 254 (of FIG. 2).

In various embodiments, one or more of the memory interface 830, an interrupt controller (not shown), and the fabric 810 uses control logic to ensure coherence among the different processor complexes 860A-860B and peripheral devices. In some embodiments, this circuitry uses cache coherency logic employing a cache coherency protocol to ensure data accessed by each source is kept up to date. An example of a cache coherency protocol includes the MOESI protocol with the Modified (M), Owned (0), Exclusive (E), Shared (S), and Invalid (I) states.

Although a single memory 840 is shown, computing system 800 may include multiple memory components arranged in a memory hierarchy. For example, memory 840 may include one or more of a shared last-level cache if it is not included in the memory interface 830, an SDRAM or other type of RAM, on-die flash memory, and so forth. In various designs, the memory 840 stores one or more applications. In an example, a copy of at least a portion of an application is loaded into an instruction cache in one of the processors 870A-870B when the application is selected by a base operating system (OS) for execution.

Memory 840 also stores source data for applications in addition to result data and intermediate data generated during the execution of applications. A virtual address space for the data stored in memory 840 and used by a software process is typically divided into pages of a prefixed size. The virtual pages are mapped to frames of physical memory. The mappings of virtual addresses to physical addresses, where virtual pages are loaded in the physical memory, are stored in a page table in memory 840. Each of translation lookaside buffers (TLBs) 868 and TLBs within the processors 870A-870B stores a subset of the page table.

In some embodiments, the components 862-878 of the processor complex 860A are similar to the components in the processor complex 860B. In other embodiments, the components in the processor complex 860B are designed for lower power consumption, and therefore, include control logic and processing capability producing less performance. For example, supported clock frequencies may be less than supported clock frequencies in the processor complex 860A. In addition, one or more of the processors in processor complex 860B may include a smaller number of execution pipelines and/or functional blocks for processing relatively high power consuming instructions than what is supported by the processors 870A-870B in the processor complex 860A.

As shown, processor complex 860A uses a fabric interface unit (FIU) 862 for providing memory access requests and responses to at least the processors 870A-870B. Processor complex 860A also supports a cache memory subsystem which includes at least cache 866. In some embodiments, the cache 866 is a shared off-die level two (L2) cache for the processors 870A-870B although an L3 cache is also possible and contemplated.

In some embodiments, the processors 870A-870B use a homogeneous architecture. For example, each of the processors 870A-870B is a general-purpose processor, such as a central processing unit (CPU), which utilizes circuitry for executing instructions according to a predefined general-purpose instruction set. Any of a variety of instruction set architectures (ISAs) may be selected. In some embodiments, each core within processors 870A-870B supports the out-of-order execution of one or more threads of a software process and include a multi-stage pipeline. The processors 870A-870B may support the execution of a variety of operating systems.

In other embodiments, the processors 870A-870B use a heterogeneous architecture. In such embodiments, one or more of the processors 870A-870B is a highly parallel data architected processor, rather than a CPU. In some embodiments, these other processors of the processors 870A-870B use single instruction multiple data (SIMD) cores. Examples of SIMD cores are graphics processing units (GPUs), digital signal processing (DSP) cores, or otherwise.

In various embodiments, each one of the processors 870A-870B uses one or more cores and one or more levels of a cache memory subsystem. The processors 870A-870B use multiple one or more on-die levels (L1, L2, L3 and so forth) of caches for accessing data and instructions. If a requested block is not found in the on-die caches or in the off-die cache 866, then a read request for the missing block is generated and transmitted to the memory interface 830 via fabric 810.

Figure 9:
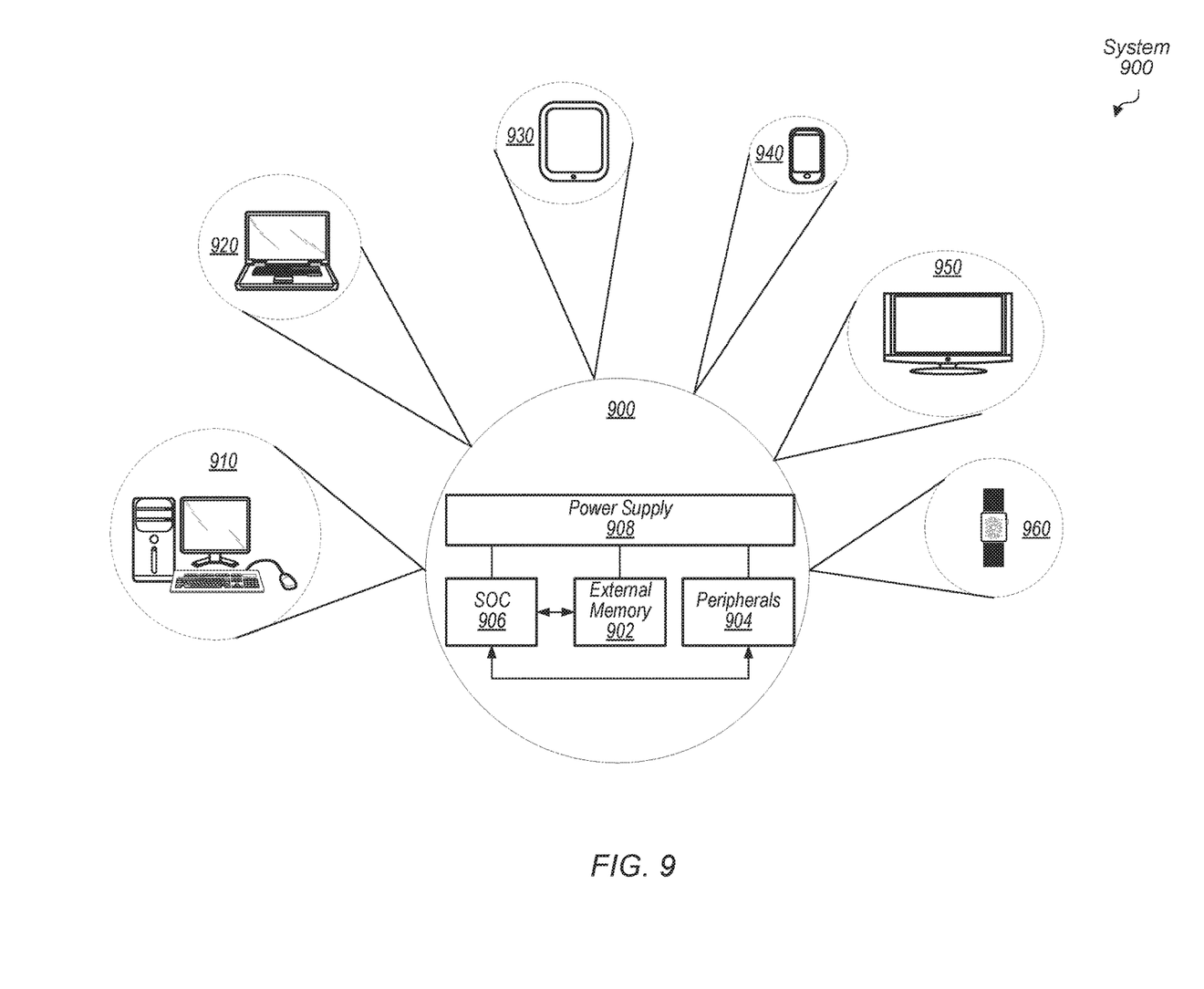
FIG. 9 is a block diagram of one embodiment of a system.

Turning next to FIG. 9, a block diagram of one embodiment of a system 900 is shown. As shown, system 900 represents chip, circuitry, components, etc., of a desktop computer 910, laptop computer 920, tablet computer 930, cell or mobile phone 940, television 950 (or set top box coupled to a television), wrist watch or other wearable item 960, or otherwise. Other devices are possible and are contemplated. In the illustrated embodiment, the system 900 includes at least one instance of a system on chip (SoC) 906 which includes multiple processors and a communication fabric. In some embodiments, one or more of SoC 906 and external memory 902 includes a memory controller similar to memory controller 230 (of FIG. 2) or memory interface 830 of computing system 800 (of FIG. 8). In various embodiments, SoC 906 is coupled to external memory 902, peripherals 904, and power supply 908.

The power supply 908 provides the supply voltages to SoC 906 as well as one or more supply voltages to the memory 902 and/or the peripherals 904. In various embodiments, power supply 908 represents a battery (e.g., a rechargeable battery in a smart phone, laptop or tablet computer). In some embodiments, more than one instance of SoC 906 is included (and more than one external memory 902 is included as well).

The memory 902 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 904 include any desired circuitry, depending on the type of system 900. For example, in one embodiment, peripherals 904 includes devices for various types of wireless communication, such as Wi-Fi, Bluetooth, cellular, global positioning system, etc. In some embodiments, the peripherals 904 also include additional storage, including RAM storage, solid-state storage, or disk storage. The peripherals 904 include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computer during use to provide the program instructions and accompanying data to the computer for program execution. In some embodiments, a synthesis tool reads the program instructions in order to produce a netlist including a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
a timer corresponding to a first power-performance state (p-state) of a plurality of p-states of a memory; and
circuitry configured to:
   transfer data with the memory while the memory is operating in a second e-state different from the first p-state; and
   responsive to receipt of a first indication to transition the memory from the second p-state to the first p-state:
      inspect the timer; and
      prevent calibration of the memory based at least in part on making
         a determination that the timer has not expired after inspecting the timer.

2. The apparatus as recited in claim 1, wherein in based at least in part on a determination that calibration of the memory is prevented, the circuitry is further configured to convey a second indication to one or more agents that a latency for the transition to the first p-state does not include an added latency for memory calibration.

3. The apparatus as recited in claim 1, wherein the circuitry is further configured to prevent calibration of the memory based at least in part on:
receipt of an indication specifying to transition the memory to using operating parameters of the first p-state; and
a determination that:
   the timer has expired, upon inspection of the timer responsive to receipt of the indication; and
   another transition to another p-state will occur within a threshold amount of time.

4. The apparatus as recited in claim 1, wherein the circuitry is further configured to permit calibration of the memory based at least in part on:
receipt of an indication to transition the memory to using operating parameters of the first p-state; and
a determination that the timer has expired, upon inspection of the timer responsive to receipt of the indication.

5. The apparatus as recited in claim 4, wherein based at least in part on a determination that the calibration of the memory has completed, the circuitry is further configured to initialize the timer to indicate a duration during which memory calibration is not to be performed.

6. The apparatus as recited in claim 5, wherein the circuitry is further configured to update the timer while transferring data with the memory using operating parameters of the first p-state.

7. The apparatus as recited in claim 5, wherein in response to receiving an indication to transition the memory to using operating parameters of another p-state different from the first p-sate, the circuitry is further configured to prevent updating the first timer.

8. The apparatus as recited in claim 5, wherein the apparatus further comprises a respective timer for each of the plurality of p-states.

9. A method, comprising:
maintaining, by circuitry in a memory controller, a first timer corresponding to a first power-performance state (p-state) of a plurality of p-states of a memory;
receiving, by the circuitry, memory requests from one or more agents;
transferring, by the circuitry, data with the memory while the memory is operating in a second p-state different from the first p-state; and
in response to receiving, by the circuitry, a first indication to transition the memory from the second p-state to the first p-state:
   inspecting, by the circuitry, the timer; and
   preventing, by the circuitry, calibration of the memory based at least in part on making a determination that the timer has not expired after inspecting the timer.

10. The method as recited in claim 9, wherein in response to preventing calibration of the memory, the method further comprises conveying a second indication to the one or more agents that a latency for the transition to the first p-state does not include an added latency for memory calibration.

11. The method as recited in claim 9, further comprising preventing calibration of the memory responsive to:
receiving an indication specifying to transition the memory to using operating parameters of the first p-state; and
determining:
   the timer has expired, upon inspecting the timer responsive to receiving the first indication; and
   another transition to another p-state will occur within a threshold amount of time.

12. The method as recited in claim 11, wherein in response to determining the calibration of the memory has completed, the method further comprises initializing the timer to indicate a duration during which memory calibration is not to be performed.

13. The method as recited in claim 12, further comprising updating the timer while transferring data with the memory using operating parameters of the first p-state.

14. The method as recited in claim 12, wherein in response to receiving an indication to transition the memory to using operating parameters of another p-state different from the first p-sate, the method further comprises preventing updating the timer.

15. The method as recited in claim 12, further comprising maintaining a respective timer for each of the plurality of p-states.

16. A computing system comprising:
one or more agents, each configured to generate memory requests;
a memory controller;
a memory configured to store data requested by the one or more agents;
a power manager configured to send updated power-performance states (p-states) to the one or more agents and the memory; and
wherein the memory controller is configured to:
   maintain a timer corresponding to a first p-state of a plurality of p-states of the memory;
   receive memory requests from the one or more agents;

transfer data with the memory while the memory is operating in a second e-state different from the first p-state; and responsive to receipt of a first indication to transition the memory from the second p-state to the first p-state:

inspect the timer; and prevent calibration of the memory based at least in part on making a determination that the timer has not expired after inspecting the timer.

17. The computing system as recited in claim 16, wherein in response to preventing calibration of the memory, the memory controller is further configured to convey a second indication to one or more agents that a latency for the transition to the first p-state does not include an added latency for memory calibration.

18. The computing system as recited in claim 16, wherein the memory controller is further configured to prevent calibration of the memory responsive to:

receiving an indication specifying to transition the memory to using operating parameters of the first p-state; and determining:

the timer has expired, upon inspecting the timer responsive to receiving the first indication; and another transition to another p-state will occur within a threshold amount of time.

19. The computing system as recited in claim 18, wherein in response to determining the calibration of the memory has completed, the memory controller is further configured to initialize the timer to indicate a duration during which memory calibration is not to be performed.

20. The computing system as recited in claim 18, wherein the memory controller is further configured to update the timer while transferring data with the memory using operating parameters of the first p-state.

\* \* \* \* \*

UNITED STATES PATENT AND TRADEMARK OFFICE
CERTIFICATE OF CORRECTION

PATENT NO. : 11,226,752 B2
APPLICATION NO. : 16/293398
DATED : January 18, 2022
INVENTOR(S) : Notani et al.

Page 1 of 1

It is certified that error appears in the above-identified patent and that said Letters Patent is hereby corrected as shown below:

On the Title Page

Item (57) Abstract
Line 16, please delete "e-state" and insert -- p-state --.

In the Specification

Column 8, Line 49, please delete "e-state" and insert -- p-state --.

In the Claims

Column 13, Claim 1, Line 23, please delete "e-state" and insert -- p-state --.

Column 14, Claim 7, Line 2, please delete "p-sate" and insert -- p-state --.

Column 14, Claim 7, Line 3, please delete "first".

Column 14, Claim 9, Line 8, please delete "first".

Column 14, Claim 14, Line 50, please delete "p-sate" and insert -- p-state --.

Column 15, Claim 16, Line 2, please delete "e-state" and insert -- p-state --.

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*